United States Patent
Arao

(10) Patent No.: US 11,451,182 B2
(45) Date of Patent: Sep. 20, 2022

(54) POWER CONVERSION DEVICE, MOTOR CONTROL SYSTEM, AND PARAMETER SETTING METHOD THEREFOR

(71) Applicant: Hitachi Industrial Equipment Systems Co., Ltd., Tokyo (JP)

(72) Inventor: Yusuke Arao, Tokyo (JP)

(73) Assignee: Hitachi Industrial Equipment Systems Co., Ltd., Tokyo (JP)

(*) Notice: Subject to any disclaimer, the term of this patent is extended or adjusted under 35 U.S.C. 154(b) by 363 days.

(21) Appl. No.: 16/644,400

(22) PCT Filed: Dec. 7, 2017

(86) PCT No.: PCT/JP2017/044088
§ 371 (c)(1),
(2) Date: Mar. 4, 2020

(87) PCT Pub. No.: WO2019/111395
PCT Pub. Date: Jun. 13, 2019

(65) Prior Publication Data
US 2021/0075359 A1    Mar. 11, 2021

(51) Int. Cl.
*G01R 31/26* (2020.01)
*H02P 29/00* (2016.01)
*G01R 31/34* (2020.01)
*H02M 7/217* (2006.01)
*H02P 31/00* (2006.01)

(52) U.S. Cl.
CPC ............ *H02P 29/00* (2013.01); *G01R 31/343* (2013.01); *H02M 7/217* (2013.01); *H02P 31/00* (2013.01)

(58) Field of Classification Search
USPC .................................................. 324/503, 426
See application file for complete search history.

(56) References Cited

U.S. PATENT DOCUMENTS

2007/0282465 A1    12/2007    Shoda et al.
2008/0018288 A1    1/2008    Malrait et al.
(Continued)

FOREIGN PATENT DOCUMENTS

JP    2007-129801 A    5/2007
JP    2008-29193 A    2/2008
(Continued)

OTHER PUBLICATIONS

International Search Report (PCT/ISA/210) issued in PCT Application No. PCT/JP2017/044088 dated Mar. 13, 2018 with English translation (three (3) pages).
(Continued)

*Primary Examiner* — Vincent Q Nguyen
(74) *Attorney, Agent, or Firm* — Crowell & Moring LLP

(57) ABSTRACT

A power conversion device includes an AC conversion unit; a detector that detects an output current, a DC voltage, and a temperature; an I/O unit; and a control unit. The control unit includes a motor control unit that controls the AC conversion unit; an operation instruction/parameter setting unit that converts an operation instruction and a parameter; an information management unit; an I/O control unit; and a detection unit that acquires data of the detector. The operation instruction/parameter setting unit outputs the set parameter and characteristic data to the information management unit, which acquires parameter information associated with the operation instruction and parameter information for an operation instruction change quantity required for adjustment from an information server. The operation instruction/parameter setting unit converts the operation instruction into a parameter using the data acquired by the detection unit and the parameter information and sets the parameter in the motor control unit.

6 Claims, 8 Drawing Sheets

(56) References Cited

U.S. PATENT DOCUMENTS

| | | | |
|---|---|---|---|
| 2009/0096395 A1 | 4/2009 | Nakayama | |
| 2010/0193267 A1 | 8/2010 | Nozawa | |
| 2014/0114523 A1* | 4/2014 | Hirasawa | B60W 20/40 |
| | | | 903/930 |
| 2015/0377970 A1 | 12/2015 | Takei | |
| 2019/0146026 A1* | 5/2019 | Kimura | G01R 31/2642 |
| | | | 324/750.03 |

FOREIGN PATENT DOCUMENTS

| | | |
|---|---|---|
| JP | 2009-27833 A | 2/2009 |
| JP | 2014-204562 A | 10/2014 |
| JP | 2015-154636 A | 8/2015 |
| JP | 2016-19304 A | 2/2016 |
| WO | WO 2006/022276 A1 | 3/2006 |
| WO | WO 2014/178331 A1 | 11/2014 |

OTHER PUBLICATIONS

Japanese-language Written Opinion (PCT/ISA/237) issued in PCT Application No. PCT/JP2017/044088 dated Mar. 13, 2018 with partial English translation (nine (9) pages).

Japanese-language Notice of Reasons for Refusal issued in Japanese Application No. 2019-557960 dated Mar. 16, 2021 with English translation (7 pages).

\* cited by examiner

POWER CONVERSION DEVICE, MOTOR CONTROL SYSTEM, AND PARAMETER SETTING METHOD THEREFOR

TECHNICAL FIELD

The present invention relates to parameter setting of a power conversion device.

BACKGROUND ART

As a background art in this technical field, there is Patent Document 1. Patent Document 1 discloses a motor control device that outputs a position command pattern, operates the motor multiple times according to the position command pattern to acquire a plurality of driving characteristic data of the motor, and outputs information of the plurality of driving characteristic data to a display device that displays the acquired plurality of driving characteristic data, in which a parameter corresponding to one piece of driving characteristic data selected from the plurality of driving characteristic data displayed on the display device is configured to be able to be set as a control parameter of the motor. Thus, it is disclosed that an operator can set a control parameter corresponding to one piece of driving characteristic data from the display device.

CITATION LIST

Patent Document

Patent Document 1: JP 2014-204562 A

SUMMARY OF THE INVENTION

Problems to be Solved by the Invention

However, in the method of Patent Document 1, it is necessary to select the driving characteristic data from the plurality of driving characteristic data, and it is necessary to be able to determine whether the driving characteristic data is good or bad. That is, it is necessary to sufficiently know detailed knowledge of the motor control. However, an operator who adjusts at an actual site may not necessarily be a person who is familiar with motor control even though the operator has general electrical knowledge, and thus, there is a problem that it is difficult to select optimal driving characteristic data. In addition, in the method of Patent Document 1, in order to obtain good driving characteristic data, it is necessary to perform parameter adjustment through trial and error by repeatedly changing the parameters, that is, checking the driving characteristic data by changing the parameters, and thus, there is a problem that it is difficult to adjust parameters unless a skillful worker or designer who is present at the site.

Solutions to Problems

The present invention has been made in view of the background art and problems described above, and, for example, the present invention is to provide a power conversion device including: an AC conversion unit that converts a DC voltage into a desired AC voltage; a detector that detects an output current of the AC conversion unit, the DC voltage, and a temperature of the AC conversion unit; an I/O unit that is a user interface; and a control unit, in which the control unit includes: a motor control unit that controls the AC conversion unit; an operation instruction/parameter setting unit that converts an operation instruction and a parameter; an information management unit that manages information; an I/O control unit that controls the I/O unit; and a detection unit that acquires data of the detector, in which the operation instruction/parameter setting unit outputs the set parameter and characteristic data to the information management unit, in which the information management unit acquires parameter information associated with the operation instruction and parameter information for an operation instruction change quantity required for adjustment from an information server via an external network and outputs the acquired parameter information to the operation instruction/parameter setting unit, and in which the operation instruction/parameter setting unit converts the operation instruction input to the I/O unit into a parameter by using the data acquired by the detection unit and the information from the information management unit and sets the parameter in the motor control unit.

Effects of the Invention

According to the present invention, it is possible to provide a power conversion device, a motor control system, and a parameter setting method capable of easily and appropriately adjusting complicated parameters.

MODE FOR CARRYING OUT THE INVENTION

Hereinafter, embodiments of the present invention will be described with reference to the drawings.

First Embodiment

Figure 1:
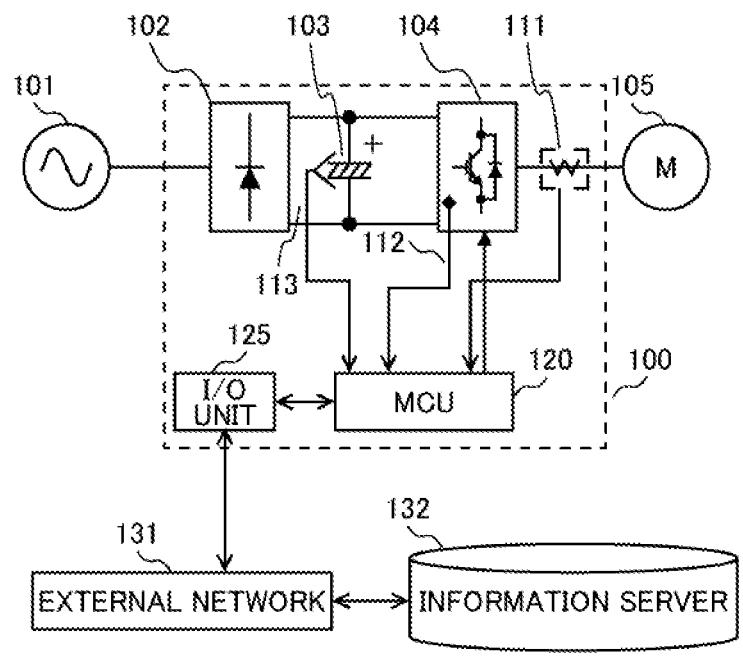
FIG. 1 is a configuration diagram of a motor control system having a power conversion device according to a first embodiment.

FIG. 1 is a configuration diagram of a motor control system having a power conversion device according to the present embodiment. In FIG. 1, the motor control system includes a three-phase AC power supply 101 that inputs power to the power conversion device 100, an AC motor 105 that is to be controlled by the power conversion device 100, an external network 131, and an information server 132.

In addition, the power conversion device 100 includes a DC conversion unit 102, a smoothing capacitor 103, an AC conversion unit 104, a current detector 111, a temperature detector 112, a DC voltage detector 113, an I/O unit 125, and a micro controller unit (MCU) 120.

Figure 2:
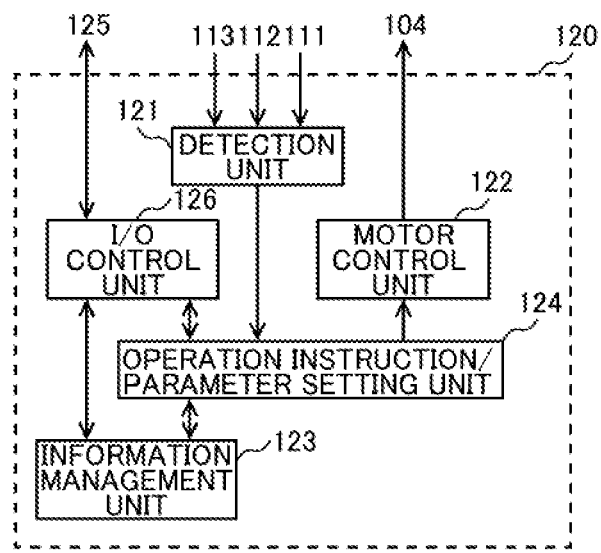
FIG. 2 is a functional block diagram of the power conversion device according to the first embodiment.

In addition, FIG. 2 illustrates functional blocks of software processing by the MCU 120. In FIG. 2, the software processing by the MCU 120 includes a detection unit 121, a motor control unit 122, an information management unit 123, an operation instruction/parameter setting unit 124, and an I/O control unit 126.

Hereinafter, the operations of the motor control system according to the present embodiment will be described in detail with reference to FIGS. 1 and 2. In FIG. 1, the three-phase AC power supply 101 is, for example, a three-phase AC voltage supplied from a power company or an AC voltage supplied from a generator and is output to a DC conversion unit 102.

The DC conversion unit 102 is configured with, for example, a DC conversion circuit including a diode or a DC conversion circuit using an IGBT and a flywheel diode and converts the AC voltage input from the three-phase AC power supply 101 into a DC voltage and outputs the DC voltage to the smoothing capacitor 103. FIG. 1 illustrates a DC conversion unit configured with a diode as an example.

The smoothing capacitor 103 smooths the DC voltage input from DC conversion unit 102 and outputs the DC voltage to the AC conversion unit 104. For example, in a case where the output of the generator is a DC voltage, the smoothing capacitor 103 may be directly input with the DC voltage from the generator without passing through the DC conversion unit 102.

The AC conversion unit 104 is configured with an AC conversion circuit using, for example, an IGBT and a flywheel diode and is input with the DC voltage of the smoothing capacitor 103 and the output command of the motor control unit 122 to convert the DC voltage into an AC voltage and output the AC voltage to the AC motor 105. In addition, in a case where the AC conversion unit 104 is configured with an AC conversion circuit that performs AC-AC conversion without passing through the smoothing capacitor 103, the AC conversion unit 104 may convert an AC voltage into an AC voltage and output the AC voltage to the AC motor 105.

The current detector 111 is configured with, for example, a plurality of Hall CTs and shunt resistors and is arranged at an output unit of the power conversion device to detect a current flowing in the AC motor 105 and output the current to the detection unit 121 as the detected current value. If the current detector 111 is arranged at a place where the output current flowing to the AC conversion unit 104 can be estimated or directly detected, for example, the current detector 111 may be arranged at a place before and after the element or above and below the DC unit. FIG. 1 illustrates an example in which a current flowing through AC motor 105 is detected.

The temperature detector 112 is configured with, for example, a thermistor resistor and is arranged at the output unit of the power conversion device or a heat generation unit at which the temperature inside the power conversion device becomes the highest to detect the temperature of the power conversion device and output the temperature to the detection unit 121 as the detected current value.

The DC voltage detector 113 is configured with, for example, a resistance voltage dividing circuit or the like and is arranged at the output unit of the power conversion device or a heat generation unit at which the temperature inside the power conversion device becomes the highest to detect the temperature of the power conversion device and output the temperature to the detection unit 121 as the detected current value.

The detection unit 121 in FIG. 2 converts, for example, the current information input from the current detector 111 into internal data with, for example, the maximum value of the rated current being taken as 100%, and outputs the internal data to the operation instruction/parameter setting unit 124. In addition, the detection unit 121 converts, for example, temperature information corresponding to the temperature input from the temperature detector 112 from, for example, conversion data having a resistance value into actual temperature data, and outputs the actual temperature data to the operation instruction/parameter setting unit 124. In addition, the detection unit 121 converts, for example, voltage information corresponding to the DC voltage input from the DC voltage detector 113 from, for example, conversion data having a resistance value into actual DC voltage data and outputs the actual DC voltage data to the operation instruction/parameter setting unit 124. For example, not limited to the above-described data, the detection unit 121 may acquire a life time diagnosis signal of an element, a signal converted by multiplying a current or voltage by a constant or being allowed to have an offset, or a signal obtained as a result of comparison with a threshold value capable of determining a current or voltage, for example, a threshold value for protecting the element.

The motor control unit 122 gives a PWM output command for driving the AC conversion unit 104 according to an output command calculated from a command given for driving the AC motor 105.

The information management unit 123 acquires the parameter information associated with the operation instruction obtained from the operation instruction/parameter setting unit 124 and the parameter information for the operation instruction change quantity required for adjustment from the information server 132 via the external network 131 and outputs the parameter information to the operation instruction/parameter setting unit 124.

The operation instruction/parameter setting unit 124 outputs the data acquired by the detection unit 121, the set parameters, and the characteristic data to the information management unit 123, inputs with the parameter information for the operation instruction of the user given from the I/O control unit 126 and the operation instruction obtained from the information management unit 123, determines the amount of change in the parameter value from each information, and outputs the internal parameters to the motor control unit 122. In addition, the operation instruction/parameter setting unit 124 inputs and stores current, voltage, and temperature information from the detection unit 121 and compares the characteristic data at the preceding motor driving time with the characteristic data at the current motor driving time to determine the data which are to be given to the motor control unit 122.

The I/O unit 125 indicates, for example, a user interface such as an operation panel, an input/output terminal, a smartphone, a smart watch, a tablet terminal, and a personal computer and outputs, for example, information operated by a user or data obtained from an external device to the I/O control unit 126. The I/O unit 125 is input with the display/ output information instructed from the I/O control unit 126 and displays/outputs the information on the user interface.

The I/O control unit 126 outputs the operation instruction information input from the operation instruction/parameter setting unit 124 to the I/O unit 125 and requests the user to select an operation instruction. That is, candidates for operation instructions are displayed. In addition, the I/O control unit 126 is input with operation information and selection information of the operation instruction from the I/O unit 125 and outputs the information to the operation instruction/parameter setting unit 124.

The external network 131 indicates a public or intra-company LAN or WAN and indicates a wired or wireless communication path.

The information server 132 is configured with, for example, a cloud or an intra-company management PC, is connected to the information management unit 123 of the power conversion device via the external network 131, and exchanges a relationship between the operation instruction and the parameter, a total number of times of adjustment at time of being performed by the user, a parameter change width, and parameter items in both directions. In addition, the information server 132 may be inside the power conversion device.

Figure 3:
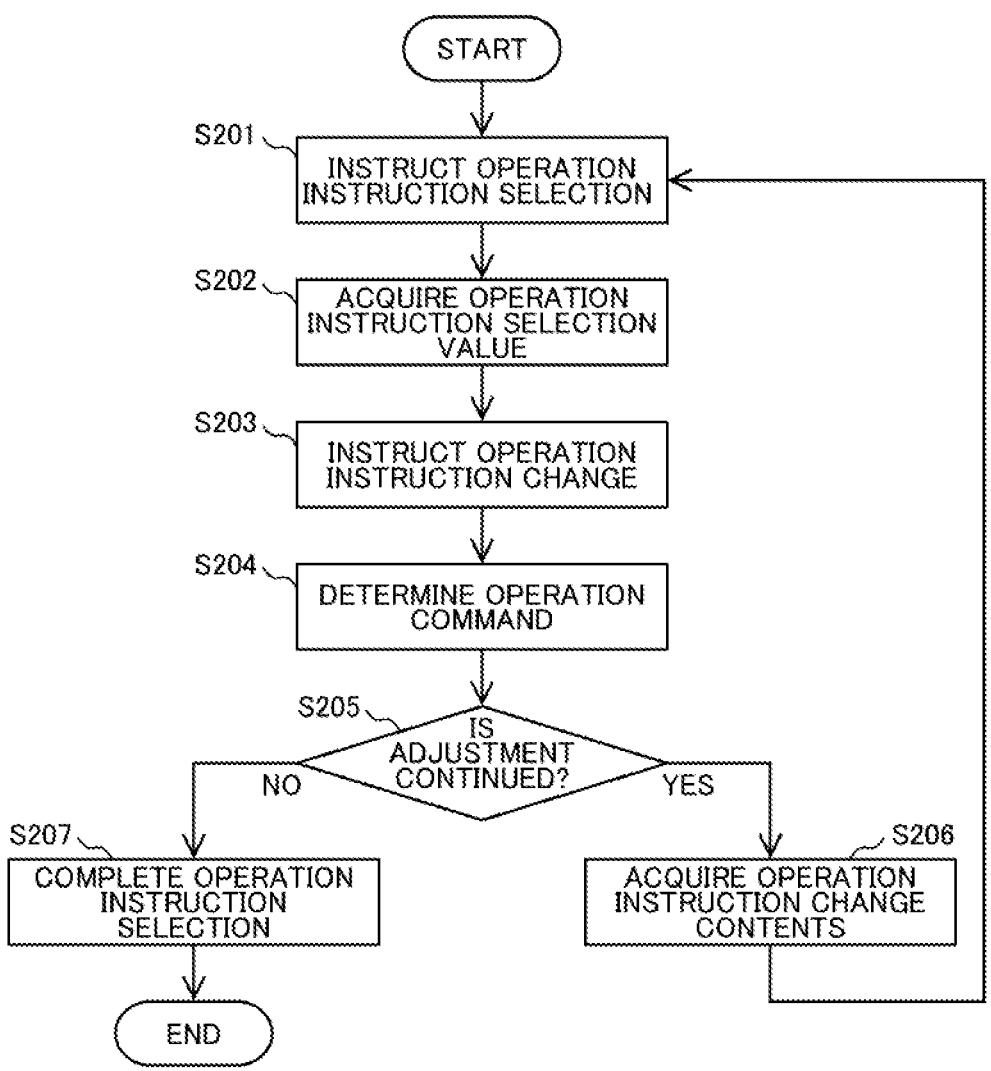
FIG. 3 is a flowchart illustrating operations of an I/O control unit according to the first embodiment.

FIG. 3 is a flowchart illustrating the operations of the I/O control unit 126. In FIG. 3, when the operation instruction selection is started by the I/O unit 125, the I/O control unit 126 outputs an operation instruction selection instruction to the I/O unit 125 (S201).

Herein, the operation instruction is data that has no meaning by itself and is not represented by a numerical value as different from a parameter. The parameter is data used for internal control software or hardware control and may be directly adjusted by a user. On the other hand, setting the operation instruction does not make sense, but the operation instruction is used in association with the parameter, the parameter is set on the basis of the operation instruction. In addition, the operation instruction selection instruction may be, for example, a question that can be answered with "Yes" or "No" to a question such as "Do you want to increase acceleration?", a close question to which the answer can be set from multiple options of "just good", "better", "worse", "too good", "too bad", and the like such as "How is the response of the motor?", or an open question or a question similar to an open question to which a topic of "inverter", "motor", "temperature", "current", "voltage", "priority to protection", "priority to control characteristics", or the like is displayed, and an option is selectively selected.

The I/O control unit 126 acquires an operation instruction input to an operation panel or a voice input terminal which is the I/O unit 125 as an operation instruction selection value (S202) and outputs the acquired operation instruction and the operation instruction selection value as an operation instruction change instruction to the operation instruction/parameter setting unit 124 (S203). In addition, the I/O unit 125 prompts the user to confirm whether or not to perform the operation, and an operation command is given to the operation instruction/parameter setting unit 124 (S204). Then, a confirmation instruction as to whether the operation instruction is satisfied is output to the I/O unit 125, and it is confirmed whether or not the adjustment is continued (S205) As the operation instruction change contents, whether or not the performed adjustment is completed and whether or not there is another operation instruction change is acquired, and the selection of the operation instruction is again instructed to the I/O unit 125 (S206). In a case where the adjustment does not need to be continued, the operation instruction selection is ended, and the end is output to the I/O unit 125 and the operation instruction/parameter setting unit 124 (S207).

Figure 4:
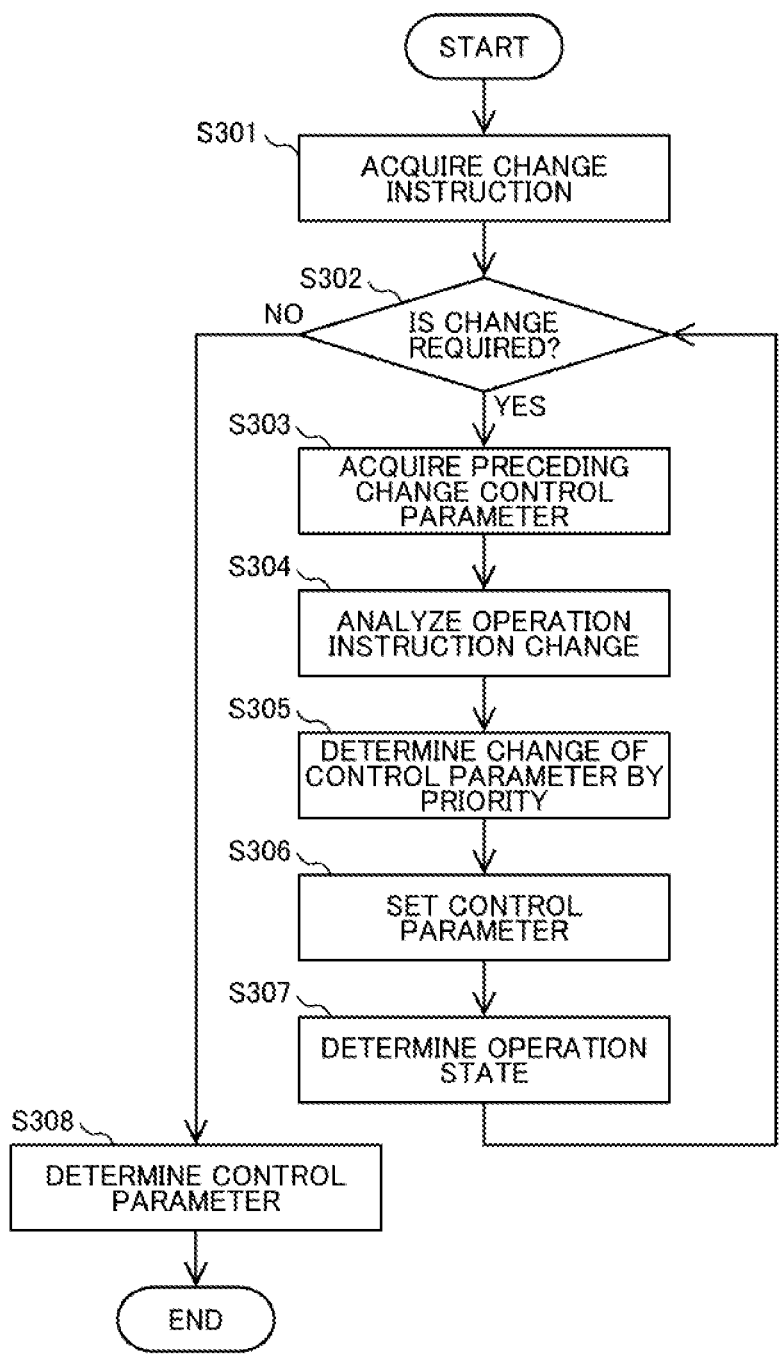
FIG. 4 is a flowchart illustrating operations of an operation instruction/parameter setting unit according to the first embodiment.

FIG. 4 is a flowchart illustrating the operations of the operation instruction/parameter setting unit 124. In FIG. 4, the operation instruction/parameter setting unit 124 acquires the change instruction output from the I/O control unit 126 (S301) and determines whether a change of parameter is required (S302). If the change is required, the preceding change control parameter information is acquired (S303).

Then, the operation instruction output by the I/O control unit 126 is analyzed (S304). In a case where the operation instruction is, for example, not the output of the power conversion device but the "speed of the system" in which the power conversion device is incorporated, and it is determined that the speed is lower than the intended speed in the case of a constant speed, the adjustment is performed by converting an adjustment target such as a secondary resistance constant of the motor as a parameter into a parameter for compensating for the slippage of the motor. In a case where the operation instruction is, for example, not the output of the power conversion device but the "response of the system" and the system is unstable such as when the system oscillates, the adjustment is performed by converting an adjustment target into a parameter for compensating the response of the motor, such as lowering the speed response gain of the motor or lowering the setting of the inertia moment as a parameter. In a case where the operation instruction is, for example, not the output of the power conversion device but the "system power" and the system forcibly operates with an excessively strong force, the adjustment is performed by converting an adjustment target into a parameter for correcting the torque of the motor such as lowering the level limiting the torque as a parameter.

In the case of the adjustment for the first time, the operation instruction/parameter setting unit 124 changes the parameter related to the operation instruction on the basis of the operation instruction and the operation instruction selection. In a case where there is the preceding adjustment information, the goodness and the badness of the preceding adjustment information is determined from the selection information of the operation instruction for the preceding adjustment, and the operation instruction is converted into the parameter to be changed (S305). For example, in a case where the user determines whether the adjustment is good or bad, if "better" is selected with respect to the operation instruction, the parameter is changed within the range smaller than the preceding adjustment parameter for the same adjustment parameter as the preceding adjustment parameter. For example, if "worse" is selected, the parameter is changed in the direction opposite to the increasing/decreasing direction of the preceding parameter for the same adjustment parameter as the preceding adjustment parameter. In addition, for example, in a case where "worse" is selected after "better" is selected, the adjustment is performed by changing the increasing/decreasing direction with a smaller increase/decrease in width than a change in width of the last data of "better". In addition, at this time, a plurality of parameters may be changed at the same time, or the priority may be determined and the parameters may be changed one type by one type. In this case, when one parameter reaches the setting limit, the adjustment may be performed by moving to the next parameter or by alternately changing a plurality of parameters.

In addition, for example, in a case where the goodness and the badness of the adjustment are determined by using a database on the information server 132 such as a cloud, if the adjustment is determined to be "change in a good direction" such as if the current, the voltage, and the temperature detected by the detection unit 121 with respect to the operation instruction are transitioned within a predetermined range, if the fluctuation with respect to the average current or the average voltage is stable, or if the upper and lower levels of the temperature become small, the parameter with respect to the same adjustment parameter as the preceding adjustment parameter is changed within a smaller range than that of the preceding adjustment parameter. Herein, the determination may be performed by the user by displaying the detection data of the detection unit 121, or the determination may be performed automatically by the operation instruction/parameter setting unit 124 on the basis of the detection data. For example, if the adjustment is determined to be "change in a bad direction", the parameter is changed in the direction opposite to the increasing/decreasing direction of the preceding parameter for the same adjustment parameter as the preceding adjustment parameter. In addition, for example, in a case where "change in a bad direction" is determined after "change in a good direction" is determined, the adjustment is performed by changing the increasing/decreasing direction with a smaller increase/decrease in width than a change in width of the last data of "change in a good direction". If it is determined that the adjustment is stable, the adjustment is completed. In addition, at this time, a plurality of parameters may be changed at the same time, or the priority may be determined and the parameters may be changed one by one. In this case, when one parameter reaches the setting limit, the adjustment may be performed by moving to the next parameter or by alternately changing a plurality of parameters. In addition, an operation instruction selection instruction for allowing the user to select an operation instruction may be set by utilizing the big data.

The operation instruction/parameter setting unit 124 changes the control parameters as described above and sets the control parameters in the motor control unit 122 (S306). In addition, in a case where an operation command is input by the user from the I/O control unit 126, the operation instruction/parameter setting unit 124 issues the operation command by using the adjusted control parameters, and acquires evaluated data such as the current, the voltage, the temperature, and the like during operation, and stores the evaluated data as data for the next adjustment (S307). In a case where the operation instruction/parameter setting unit 124 acquires information as to whether or not there is a change again and it is determined that the change is completed, the operation instruction/parameter setting unit 124 may determine the internal control parameters and, at that time, may store the parameter in the storage element (S308).

As described above, according to the present embodiment, it is possible to provide a power conversion device, a motor control system, and a parameter setting method capable of easily and appropriately adjusting complicated parameters.

Second Embodiment

In the present embodiment, a specific example of the first embodiment will be described. The configuration diagrams of the power conversion device and the system having the same in the present embodiment are the same as those illustrated in FIGS. 1 and 2 described above, and thus, the description thereof will be omitted.

Figure 5:
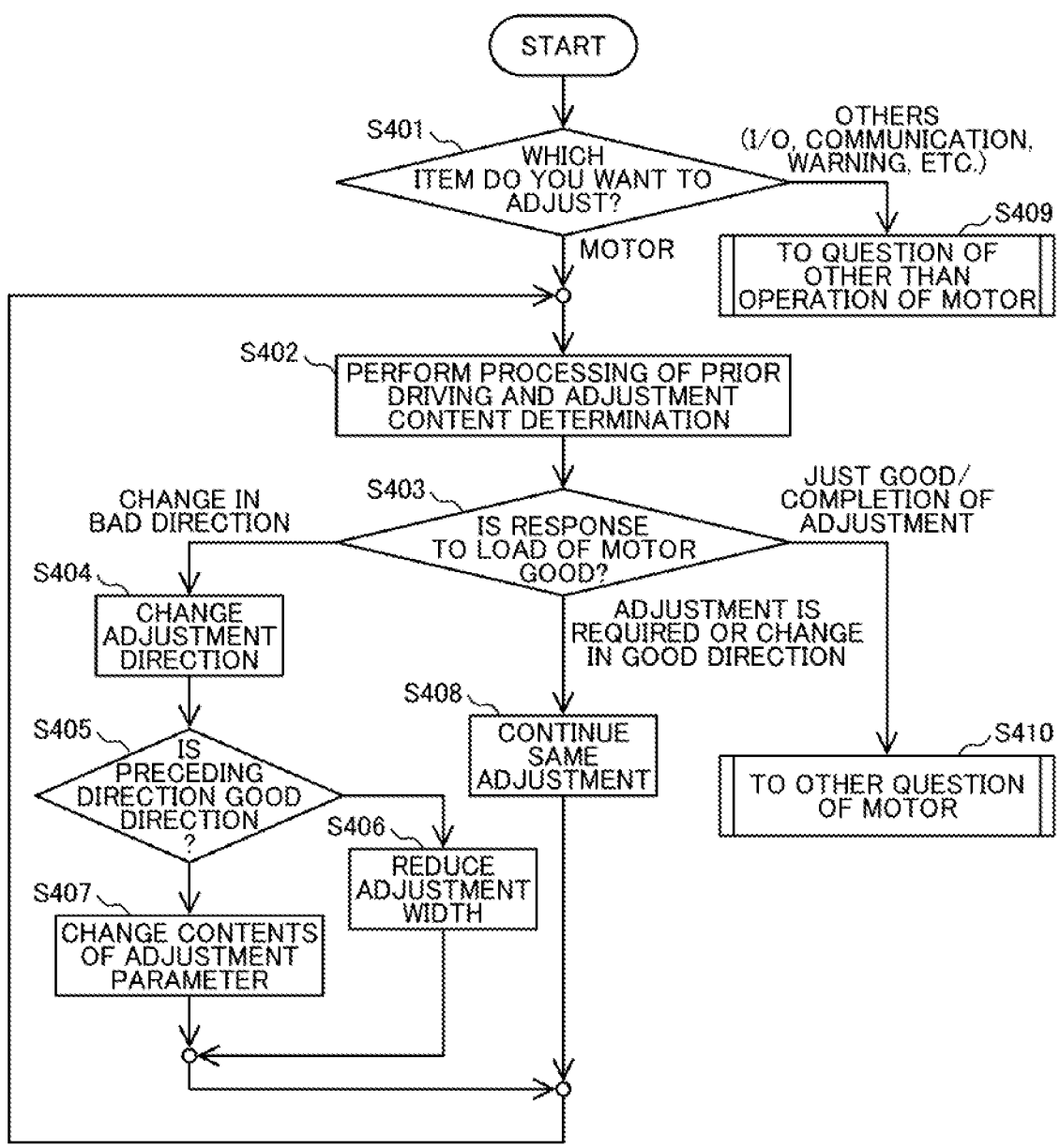
FIG. 5 is a flowchart illustrating a series of setting operations performed by a power conversion device according to a second embodiment.

FIG. 5 is a flowchart illustrating a series of setting operations performed in the power conversion device according to the present embodiment. In FIG. 5, the I/O unit 125 receives an instruction from the I/O control unit 126, first displays "Which item do you want to adjust" as selection of an adjustment item, and allows the selection to be performed (S401). If "motor" is selected, the process proceeds to S402; if not, the process proceeds to a question for setting other items (I/O, communication, warning, etc.) (S409).

In S402, processing such as prior motor driving for adjusting the parameters of the motor and acquisition of driving characteristic data is performed. Then, in S403, "Is the response to the load of the motor good?" is displayed as the operation instruction, and at the same time, options of "just good/completion of adjustment", "adjustment is required or change in a good direction" and "change in a bad direction" are displayed.

The operation instruction/parameter setting unit 124 may, for example, change 10% as a change in width of the initial adjustment with respect to 100% of the "torque response gain" calculated from constant parameter such as the resistance value, the inductance value, and the no-load current value unique to the motor and determine in advance the change in width of the time constant as 10 ms with respect to the "torque current filter", or alternatively, if there is a preferred adjustment width as data by an external server, the initial adjustment width may be determined on the basis of the adjustment data acquired through the information management unit 123.

In a case where "adjustment is required or change in a good direction" is selected in the first determination, with respect to the characteristic data of "response to the load of the motor", the control parameters "torque response gain" and "torque current filter" are adjusted to 10% and 10 ms, respectively, in the direction of increasing with the change in width of the initial adjustment. The reason for adjustment in the increasing direction is that a higher response of the motor is preferred. Alternatively, if more accurate statistical data are collected in an external server, for example, when it is preferable that the response of the motor is low in a specific field, the direction of the initial adjustment may be set in a decreasing direction by utilizing the data through the information management unit 123. The operation instruction/parameter setting unit 124 continues the same operation as the one preceding adjustment in a case where "adjustment is required or change in a good direction" is selected in the plurality of determinations (S408).

In a case where "change in a bad direction" is selected in the plurality of determinations, the operation instruction/parameter setting unit 124 changes the adjustment direction to the adjustment direction opposite to the one preceding adjustment direction (S404), and determines whether the preceding direction is in the good direction (S405). If "YES", the operation instruction/parameter setting unit 124 performs the adjustment by reducing the adjustment width of each parameter, for example, to half (S406). If "NO", the operation instruction/parameter setting unit 124 performs the adjustment by changing the contents of each parameter (S407).

In a case where "just good/completion of adjustment" is selected after a series of adjustments, the operation instruction/parameter setting unit 124 determines that the operation instruction "response to the load of the motor" is completion of adjustment, and the process proceeds to other questions about the motor, for example, "Do you prioritize protection of the motor or prioritize control characteristics?" or "Is the acceleration/deceleration of the motor optimal?" (S410). That is, in a case where prioritizing protection of the motor or prioritizing characteristics of the motor is selected or a frequency command or a torque command is input from an external voltage or current source by an analog input function, in order to improve the sensitivity of the operation instruction, the filter time constant of the parameter may be adjusted, or the adjustment may be performed by replacing the expression used as the parameter in the related art with the characteristic data and acquiring a reference determination value and an adjustment value from a database on the information server 132 such as a cloud.

As described above, according to the present embodiment, it is possible to easily and appropriately perform the adjustment of the parameters of the motor.

Third Embodiment

In the present embodiment, as a modified example of the first embodiment, an example in which the system warning level is adjusted when the power conversion device drives the AC motor in the sense of a test will be described. The configuration diagrams of the power conversion device and the system having the same in the present embodiment are the same as those illustrated in FIGS. 1 and 2 described above, and thus, the description thereof will be omitted.

Figure 6:
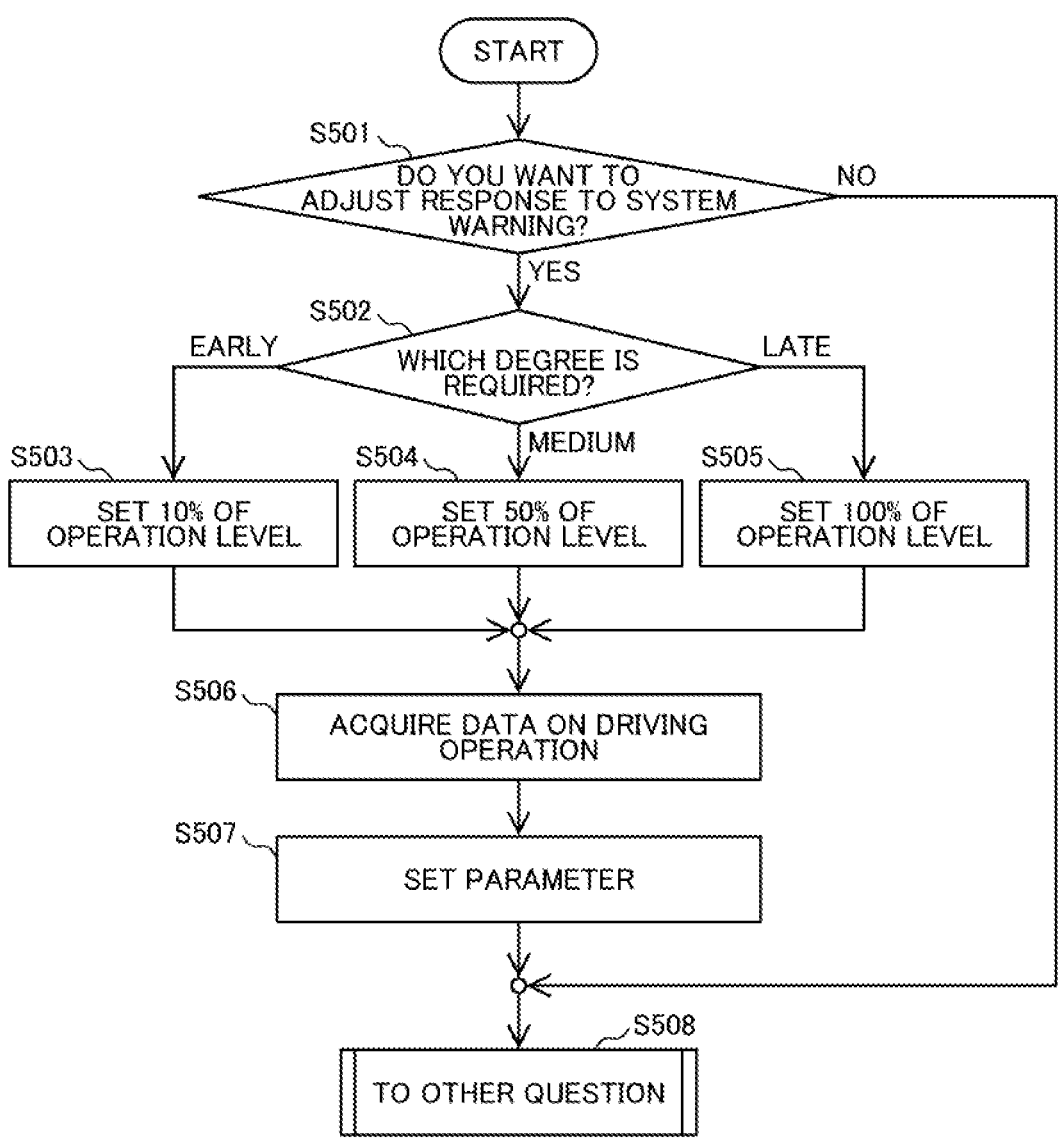
FIG. 6 is a flowchart illustrating operations of a power conversion device according to a third embodiment.

FIG. 6 is a flowchart illustrating a series of setting operations performed in the power conversion device according to the present embodiment. In FIG. 6, the I/O unit 125 receives an instruction from the I/O control unit 126, displays "Do you want to adjust the response of the system warning?" as an operation instruction, and simultaneously displays options of "Yes" and "No" (S501). When "No" is selected, the I/O control unit 126 does not need to adjust "response of system warning" as an operation instruction and goes to another question (S508). In the case of "Yes", "Which degree is required?" is displayed (S502), and for example, options such as "early", "medium", and "late" are displayed, and as the parameter levels for setting respective warning levels, 10% of the operation level is set for the case of "early" (S503), 50% of the operation level is set for the case of "medium" (S504), and 100% of the operation level is set for the case of "late" (S505).

Next, the I/O control unit 126 issues an operation command to the operation instruction/parameter setting unit 124, and the operation instruction/parameter setting unit 124 acquires data on the driving operation from the detection unit 121 (S506).

Figure 7A:
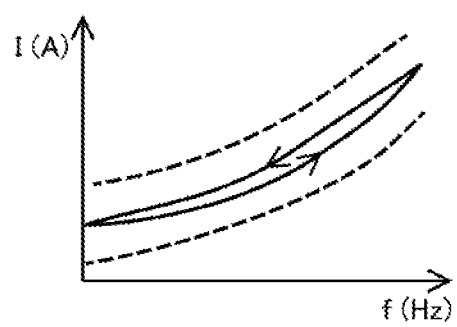
FIGS. 7A to 7C are diagrams illustrating a setting example of a system warning level of a power conversion device according to a third embodiment.
Figure 7B:
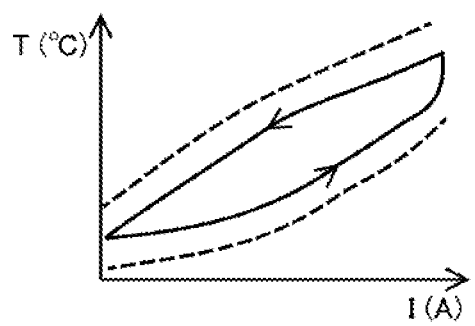
Figure 7C:
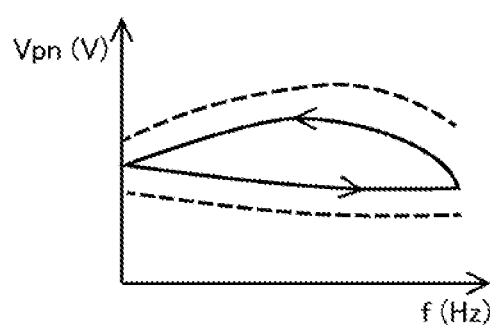

FIG. 7 plots data acquired in a driving operation state as an example. FIG. 7(1) plots the relationship between the frequency f and the current I during the driving operation. FIG. 7(2) plots the relationship between the current I and the temperature T during the driving operation. FIG. 7(3) plots the relationship between the frequency f and the DC voltage Vpn during the driving operation. Each of FIGS. 7(1), (2), and (3) illustrates a hysteresis characteristic with respect to an increase or decrease in the horizontal axis. In a case where the operation instruction/parameter setting unit 124 sets, for example, an operation level by using the respective maximum operation point as a reference point and, for example, "early" is selected, as the broken lines illustrated in FIGS. 7(1), (2), and (3), the operation instruction/parameter setting unit 124 sets the broken lines obtained by extending 10% of the operation level from the upper and the lower limits toward the outside of the range as the warning level (S507).

Figure 8A:
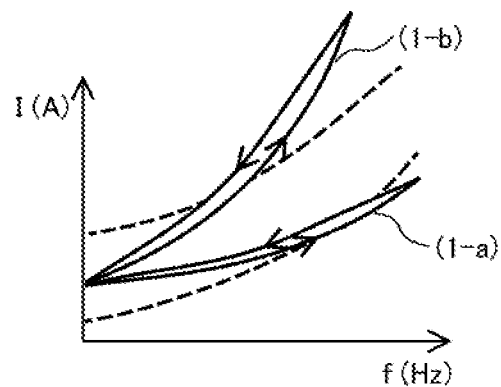
FIGS. 8A to 8C are diagrams illustrating a case where data acquired in a driving operation state of the power conversion device according to the third embodiment is abnormal.
Figure 8B:
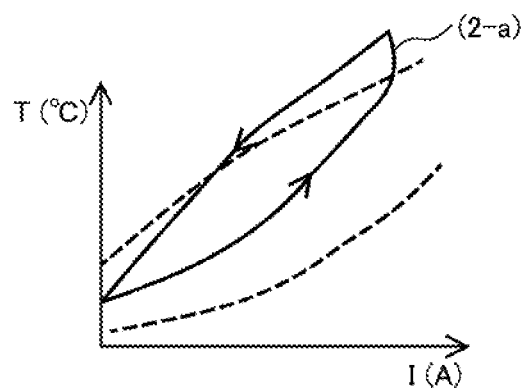
Figure 8C:
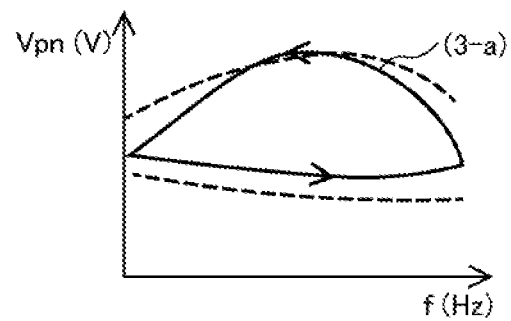

FIG. 8 illustrates a case where the data acquired in the driving operation state is abnormal as an example. FIGS. 8(1), (2), and (3) correspond to FIGS. 7(1), (2), and (3), respectively. As illustrated in FIGS. 8(1), (2), and (3), a warning is given to the user in a case where the warning level exceeds the warning level of the dashed line. For example, a case where it is detected that the current is decreased with respect to the frequency as illustrated in (1-*a*) of FIG. 8 (1) corresponds to a case where the load becomes light, for example, a case where the fluid is emptied by a fan pump or the like or a case where the luggage is removed on the conveyor or the like. In addition, a case where it is detected that the current is increased with respect to the frequency as illustrated in (1-*b*) of FIG. 8 (1) corresponds to a case where the load becomes heavy, for example, a case where the duct becomes clogged with a fan pump or the like or a case where the luggage is hooked and stacked on the conveyor or the like. In addition, a case where it is detected that the temperature is increased with respect to the current as illustrated in (2-*a*) of FIG. 8 (2) corresponds to a case where the cooling performance is reduced, for example, a case where the cooling fin of the power conversion device is clogged, a case where the number of rotations of the cooling fan of the power conversion device is decreased, a case where the temperature in the system in which the power conversion device is installed is increased, or a case where the system in which the power conversion device is installed is not cooled down appropriately. In addition, a case where it is detected that the DC voltage is increased with respect to the frequency as illustrated in (3-*a*) of FIG. 8 (3) corresponds to a case where the life time is shortened due to a decrease in the performance of the condenser or the load inertia is increased due to accumulation of dust on the system driving unit.

In addition, in the present embodiment, the setting of the warning level is changed collectively, but the setting of the warning level may be performed individually. In addition, the warning level is not limited to the contents described in FIG. 7, but the warning level should be appropriately set in accordance with the system environment, and may be issued as a display or may perform outputting as a signal. In addition, in the present embodiment, the setting is performed by one question as illustrated in FIG. 6, but if adjustment is required, as in the first embodiment, a flow for checking the completion of the adjustment may be added so as to strictly perform the adjustment.

As described above, according to the present embodiment, it is possible to easily and appropriately adjust the parameter of the system warning level.

Fourth Embodiment

In the present embodiment, a specific example of the I/O unit 125 which is a user interface will be described.

Figure 9:
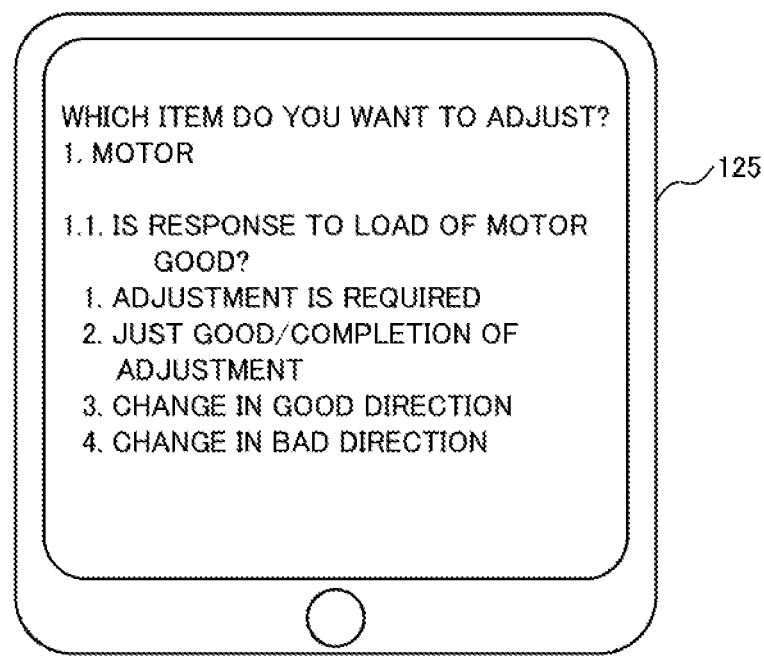
FIG. 9 is an example of a display screen of a power conversion device according to a fourth embodiment.

FIG. 9 illustrates a case where the I/O unit 125 in the present embodiment is a smartphone. In FIG. 9, upon receiving an instruction from the I/O control unit 126, for example, display corresponding to FIG. 5 is performed. In other words, adjustment item selection such as "Which item do you want to adjust?" is displayed, an operation instruction selection instruction such as "Is response to the load of the motor good?" is displayed, and as the operation instruction is to be acquired, options such as "adjustment is required", "just good/completion of adjustment", "change in a good direction", and "change in a bad direction" are displayed.

Figure 10:
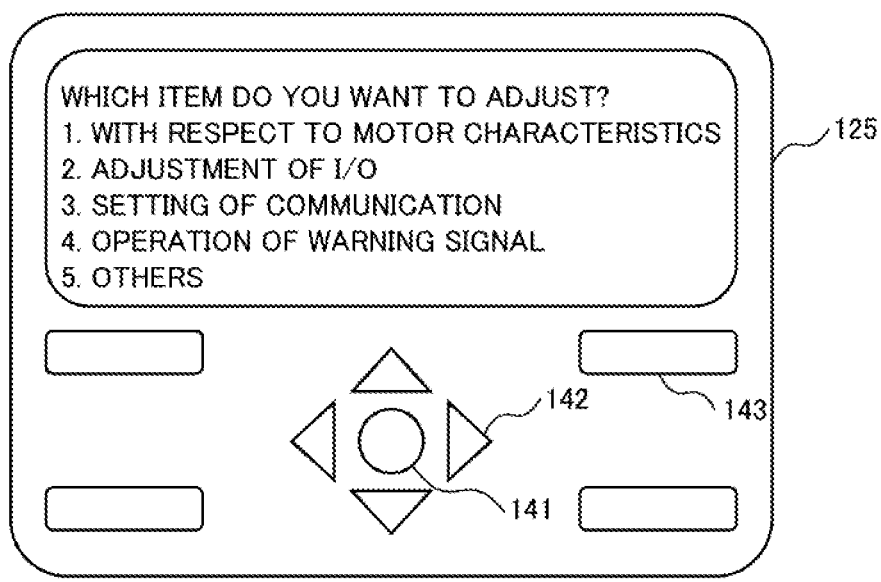
FIG. 10 is another example of the display screen of the power conversion device according to the fourth embodiment.

In addition, FIG. 10 illustrates a case where the I/O unit 125 in the present embodiment is a dedicated terminal. In FIG. 10, the adjustment item selection such as "Which item do you want to adjust?" is displayed and the options thereof are displayed in response to an instruction from the I/O control unit 126, but the operation instruction selection instruction is displayed and the options thereof are displayed as in FIG. 9. In addition, in FIG. 10, an instruction key 142 for selection, an enter key 141, a function key 143, and the like are provided.

Although the embodiments have been described above, the present invention is not limited to the above-described embodiments, and includes various modifications. For example, the above-described embodiments have been described in detail in order to describe the present invention in an easy-to-understand manner, and are not necessarily limited to those having all the described configurations. In addition, a portion of the configurations of one embodiment can be replaced with the configurations of another embodiment, and the configurations of another embodiment can be added to the configurations of one embodiment. In addition, for a portion of the configurations of each embodiment, it is possible to add/delete/replace other configurations. In addition, each of the above configurations, functions, and processing units may be realized by hardware or may be realized by software.

REFERENCE SIGNS LIST

101 Three-phase AC power supply
102 DC conversion unit
103 Smoothing capacitor
104 AC conversion unit
105 AC motor
111 Current detector
112 Temperature detector
113 DC voltage detector
121 Detection unit
122 Motor control unit
123 Information management unit
124 Operation instruction/parameter setting unit
125 I/O unit
126 I/O control unit
131 External network
132 Information server

The invention claimed is:

1. A power conversion device comprising:
an AC conversion unit that converts a DC voltage into a desired AC voltage;
a detector that detects an output current of the AC conversion unit, the DC voltage, and a temperature of the AC conversion unit;
an I/O unit that is a user interface; and
a control unit,
wherein the control unit includes:
a motor control unit that controls the AC conversion unit;
an operation instruction/parameter setting unit that converts an operation instruction and a parameter;
an information management unit that manages information;
an I/O control unit that controls the I/O unit; and
a detection unit that acquires data of the detector,
wherein the operation instruction/parameter setting unit outputs the set parameter and characteristic data to the information management unit,
wherein the information management unit acquires parameter information associated with the operation instruction and parameter information for an operation instruction change quantity required for adjustment from an information server via an external network and outputs the acquired parameter information to the operation instruction/parameter setting unit, and
wherein the operation instruction/parameter setting unit converts the operation instruction input to the I/O unit into a parameter by using the data acquired by the detection unit and the information from the information management unit and sets the parameter in the motor control unit.

2. The power conversion device according to claim 1, wherein the operation instruction/parameter setting unit causes the I/O unit to display information indicating whether or not the operation instruction can be changed and, upon receiving a request to change the operation instruction, adjusts a parameter of the power conversion device, drives the AC conversion unit, and causes the I/O unit to display the information indicating changeability of the operation instruction.

3. The power conversion device according to claim 1, wherein the operation instruction/parameter setting unit drives the AC conversion unit and automatically adjusts the parameter associated with the operation instruction on the basis of the data detected by the detection unit.

4. A parameter setting method of a power conversion device including an AC conversion unit that converts a DC voltage to a desired AC voltage, a motor control unit that controls the AC conversion unit, and a detector that detects an output current of the AC conversion unit, the DC voltage, and a temperature of the AC conversion unit, the power conversion device further including an information management unit that manages parameter information associated with the operation instruction and parameter information for data detected by the detector, a set parameter, and characteristic data, the parameter setting method comprising
converting the operation instruction input by a user into a parameter by using the data detected by the detector and information from the information management unit, and setting the parameter in the motor control unit.

5. The parameter setting method of the power conversion device according to claim 4, wherein the information management unit acquires the information from an information server via an external network.

6. A motor control system having a power conversion device that controls a motor,
wherein the power conversion device includes: an AC conversion unit that converts a DC voltage into a desired AC voltage; a detector that detects an output current of the AC conversion unit, the DC voltage, and a temperature of the AC conversion unit; an I/O unit that is a user interface; and a control unit,
wherein the control unit includes: a motor control unit that controls the AC conversion unit; an operation instruction/parameter setting unit that converts an operation instruction and a parameter; an information management unit that manages information; an I/O control unit that controls the I/O unit; and a detection unit that acquires data of the detector,
wherein the operation instruction/parameter setting unit outputs the set parameter and characteristic data to the information management unit,
wherein the information management unit acquires parameter information associated with the operation instruction and parameter information for an operation instruction change quantity required for adjustment from an information server via an external network and outputs the acquired parameter information to the operation instruction/parameter setting unit, and wherein the operation instruction/parameter setting unit converts the operation instruction input to the I/O unit into a parameter by using the data acquired by the detection unit and the information from the information management unit and sets the parameter in the motor control unit.

* * * * *